United States Patent [19]

Mozer

[11] Patent Number: 5,103,494
[45] Date of Patent: Apr. 7, 1992

[54] OPTOELECTRONIC ARRANGEMENT

[75] Inventor: Albrecht Mozer, Bietigheim-Bissingen, Fed. Rep. of Germany

[73] Assignee: Alcatel N.V., Amsterdam, Netherlands

[21] Appl. No.: 550,742

[22] Filed: Jul. 10, 1990

[30] Foreign Application Priority Data

Jul. 18, 1989 [DE] Fed. Rep. of Germany ....... 3923709

[51] Int. Cl.⁵ .............................................. G02B 6/12
[52] U.S. Cl. .................................................... 385/14
[58] Field of Search ................ 350/96.11, 96.13, 96.34

[56] References Cited

U.S. PATENT DOCUMENTS

| | | | |
|---|---|---|---|
| 4,286,838 | 9/1981 | Huignard et al. | 350/96.11 |
| 4,878,727 | 11/1989 | Boiarski et al. | 350/96.11 |
| 4,887,884 | 12/1989 | Hayden | 350/96.13 |
| 4,984,870 | 1/1991 | Herbrechtsmeier | 350/96.34 |

*Primary Examiner*—William L. Sikes
*Assistant Examiner*—Robert E. Wise
*Attorney, Agent, or Firm*—Spencer & Frank

[57] ABSTRACT

Optical components made of inorganic crystals, e.g. lithium niobate, have the drawback that they cannot be integrated on a semiconductor substrate. In addition to linear optical characteristics, polymer plastics also have strong, non-linear characteristics. According to the invention, these plastics are integrated on a semiconductor substrate and serve as polarizers, modulators, optical switches, etc. Additionally, they require less space than prior art crystals.

9 Claims, 1 Drawing Sheet

OPTOELECTRONIC ARRANGEMENT

CROSS REFERENCE TO RELATED APPLICATION

This application claims the priority of application Ser. No. P 3,923,709.5, filed July 18, 1989, in the Federal Republic of Germany, the subject matter of which is incorporated herein by reference.

BACKGROUND OF THE INVENTION

The invention relates to an optoelectronic arrangement including components that are integrated on a semiconductor substrate.

It is known from the publication Phys. Bl. 44 (1988), pages 91–97, to produce circuit arrangements for optical data transmission in a monolithically integrated manner. For example, a semiconductor laser and a photodiode and its associated monitor circuit composed of field effect transistors are epitaxially produced on a semiconductor substrate.

However, optical components employed as polarizers, modulators, optical switches must be arranged in a hybrid manner, for example alongside the semiconductor substrate. Moreover, lithium niobate or potassium titanyl phosphate crystals suitable for this purpose require much space.

Polymer plastics which have non-linear optical characteristics and could take the place of the known optical components are known from Br. Telecom. Technol. J. 6 (1988), pages 5–17. Such plastics are either derivatives of nitrobenzene, which is liquid at the normal ambient temperature, or they originate from the family of polydiacetylene. The decisive factor for the generation of these optical characteristics is that single and double bonds between the carbon atoms occur alternatingly.

Such a plastic reacts to the electric field E of electromagnetic radiation with a dielectric polarization P which can be expressed as an exponential series of the electric field E:

$$P = \epsilon_0(\chi^{(1)}E + \chi^{(2)}E^2 + \chi^{(3)}E^3 ...)$$

where $\epsilon_0$ is the dielectric constant and $\chi^{(i)}$ the susceptibility of the $i^{th}$ order. The susceptibility of the first order, $\chi^{(1)}$, produces effects which can be observed already at low intensities of the E field. It is the origin of the refractive index and the absorption of the material.

The non-linear characteristics, however, result from the higher order susceptibilities, $\chi^{(2)}$, $\chi^{(3)}$, ....

Due to susceptibility $\chi^{(2)}$, polymer plastics exhibit a refractive index which is a function of the square of the electric or magnetic field, that is, the Pockels effect or the Faraday effect, respectively.

This results in the generation of harmonics at double the frequency, the mixing of frequencies and the parametric amplification of one frequency at the expense of another frequency.

However, this article does not reveal within which frame polymer plastics can be employed for optical data transmission.

SUMMARY OF THE INVENTION

It is an object of the invention to employ these plastics to create an optoelectronic circuit arrangement that can be integrated to a greater degree.

This is accomplished in that the circuit arrangement includes an optical component that is composed of a polymer plastic and is integrated on the semiconductor substrate.

One advantage of the invention is that the polymer plastics have more distinct non-linear characteristics than inorganic crystals and can be manufactured more economically.

Further features of the invention are described below.

BRIEF DESCRIPTION OF THE DRAWINGS

Embodiments of the invention will be described below with reference to the drawing figures. Wherein.

DETAILED DESCRIPTION OF THE PREFERRED EMBODIMENTS

Figure 1:
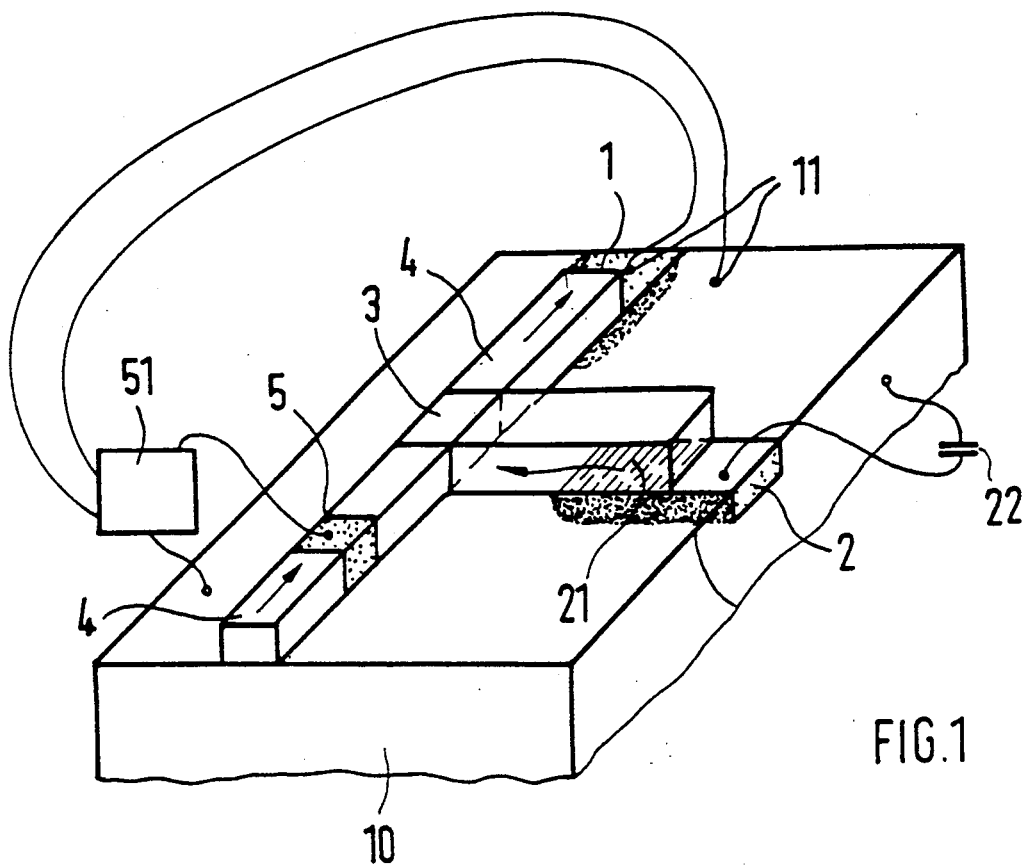
FIG. 1 an optoelectronic arrangement including an optical receiver.

An optical receiver (FIG. 1) is composed of a photodiode 1 for the reception of light signals, a semiconductor laser 2 as a local oscillator, a waveguide 4, a polarizer 5 and a directional coupler 3, all integrated on a semiconductor substrate 10.

This arrangement is considered to be monolithic because it has been created on the semiconductor substrate 10 solely by process steps such as vapor-deposition and doping, that is, without soldering, glueing, pressing, etc.

Semiconductor laser 2, which may be, for example, a monomode DFB (distributed feedback) laser, includes a Bragg reflector 21 and is controlled via a current source 22.

It serves as local oscillator and transmits light at a fixed frequency which, in directional coupler 3, is superposed on the light received via waveguide 4. Since the waveguide 4 shown here constitutes only the final component in a transmission path many kilometers in length, the polarization state of the optical radiation is arbitrary. Therefore, the polarization state is adjusted by way of polarizer 5 so as to obtain the correct polarization position for the local oscillator. The polarizer 5 converts the generally elliptically polarized light to linearly polarized light so that the subsequent directional coupler 3 is able to provide for perfect superposition on the linearly polarized light of semiconductor laser 2.

Polarizer 5 is composed of a polymer plastic and has a thickness $$d = \frac{\lambda}{4(n_{ao} - n_o)}$$

Polarizer 5 is a $\lambda/4$ wafer or a quarter wave plate having an ordinary refractive index $n_o$ and an extraordinary refractive index $n_{ao}$. $\lambda$vac pr $\lambda$ here indicates the light wavelength in a vacuum.

An electric field is applied to polarizer 5 by means of a control unit 51, permitting adjustment of the polarization direction of the light on the basis of the Pockels effect or the Kerr effect. The current furnished by control unit 51 can be regulated in dependence on the current flowing through the photodiode 1.

The latter has electrical terminals 11 via from which control unit 51 receives a control current.

The manufacture of such a circuit arrangement corresponds in every way to known manufacturing processes. In succession, further semiconductor layers of different compositions are epitaxially deposited on the semiconductor substrate 10 and are doped as required in order to change the electrical conductivity or the refractive index.

Optical waveguide 4 is also produced epitaxially. It is composed of semiconductor layers or silicon compounds (e.g. silicon dioxide, silicon nitride). In a lithography step, the waveguide 4 is provided with a recess into which the polymer plastic forming polarizer 5 is introduced after the remaining components have been covered. Then, the electrical contacts for photodiode 1, semiconductor laser 2 and polarizer 5 are vapor-deposited through a contact mask.

Figure 2:
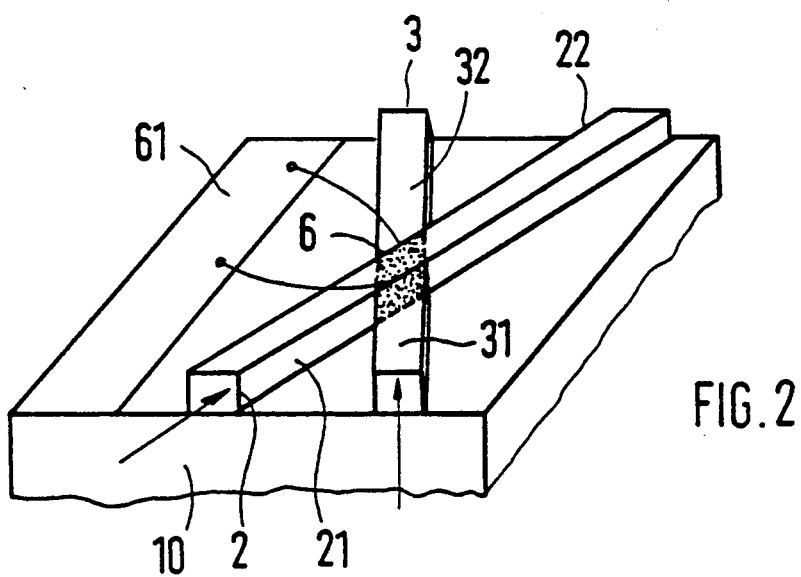
FIG. 2 an optoelectronic arrangement including an optical switch.

Another use for a polymer plastic is as an optical switch 6, e.g. an AND-gate (FIG. 2). Two optical waveguides 2, 3 intersect on semiconductor substrate 10. Their cross-over point constitutes switch 6 which is controlled by a control circuit 61.

Optical waveguides 2, 3 are composed of optical waveguide branches 21, 22 and 31, 32, respectively. If light is fed only into optical waveguide branch 21 of optical waveguide 1, it does not reach the output of switch 6 on the opposite side which leads to optical waveguide branch 22 because in this configuration the light is unable to pass through the plastic. If, however, light is also coupled into optical waveguide branch 31 of optical waveguide 3 or the polarization P of switch 6 is changed by the application of a voltage to control unit 61 which controls switch 6, the light exits at one of the optical waveguide branches 22 or 32, or at both.

In this way, two switching functions can be performed: either, one of the two optical waveguide branches 22, 32 receives light only if an electric field is applied to control unit 61 or, if light is fed into both optical waveguide branches 21 and 31, an AND-linkage takes place in optical waveguide branches 22, 32.

Another use for the plastic is its utilization, on the basis of its susceptibility $\chi^{(2)}$, to double the frequency. If laser light in the red range is coupled into the switch, the radiation is transported in the optical waveguide in the blue or ultraviolet range as a result of its frequency having been doubled in a component made of the polymer plastic.

A component made of a polymer plastic can be employed for any type of modulation: as amplitude modulator as illustrated in the first embodiment of switch 6; as frequency modulator, if sum and difference frequencies are formed of the light frequency and the modulation frequency by the application of an alternating electric field to the component; or as phase modulator with short-term frequency shift keying in the component.

It will be understood that the above description of the present invention is susceptible to various modifications, changes and adaptations, and the same are intended to be comprehended within the meaning and range of equivalents of the appended claims.

What is claimed is:

1. In an optoelectronic arrangement including components that are integrated on a semiconductor substrate, the improvement comprising a polarizer in the form of a λ/4 wafer whose optical length can be controlled by means of an electric field, the polarizer being composed of a polymer plastic and being integrated on the semi-conductor substrate.

2. An optoelectronic arrangement according to claim 1, wherein there is arranged on said substrate an optical receiving device including a photodiode, a monomode semicondutor laser forming a local oscillator, an optical waveguide, a directional coupler and said plarizer, with elliptically polarized light exiting from the optical waveguide being linearly polarized by said polarizer.

3. An optoelectronic arrangement according to claim 2, further comprising a control circuit connected to the photodiode and the polarizer for receiving a photodiode signal from the photodiode so that, upon a change in light intensity at the photodiode, the electric field in the polarizer is adjusted by way of an adjustment voltage generated by the control circuit in such a manner that a resulting polarization adjustment of the polarizer causes light fed into the photodiode to have a maximum intensity.

4. A method of producing the optoelectronic arrangement according to claim 2, comprising the steps of:

successively epitaxially depositing semiconductor layers on the semiconductor substrate and partially doping said semiconductor layers of diffusion for changing their electrical conductivity or refractive index;

epitaxially producing the optical waveguide, the latter being composed of semiconductor layers or of silicon compounds and being lithographically provided with a recess;

precipitating the polymer plastic forming the polarizer into the recess; and thereafter vapor-depositing through a contact mask, electrical contacts for the photodiode, the semiconductor laser and the polarizer.

5. An optoelectronic arrangement according to claim 1, wherein the cross-over point between two intersecting optical waveguides is composed of the polymer plastic; and the cross-over point forms an optical switch at which the light from the one optical waveguide is coupled into the respectively other optical waveguide.

6. An optoelectronic arrangement according to claim 5, wherein an alternating electric field is applied to the optical switch; and the light transmitted through the one optical waveguide is modulated with the light of the other optical waveguide.

7. In an optoelectronic arrangement including components that are integrated on a semiconductor substrate, the improvement comprising;

a polarizer comprising a polymer plastic and integrated on the semiconductor substrate in the form of a λ/4 plate having an optical length which varies in accordance with an electric field applied across said polarizer.

8. The optoelectronic device according to claim 7, wherein there is arranged on said substrate:

a photodiode;

a monomode semiconductor laser outputting a local oscillator signal;

an optical waveguide, optically coupled to said photo diode, for receiving and guiding an optical signal, said polarizer, arranged in said optical waveguide and linearly polarizing the optical signal resulting in a linearly polarized optical signal; and a directional coupler, arranged in said optical waveguide downstream from said polarizer and upstream from said photodiode, for optically coupling the local oscillator signal with the linearly polarized optical signal and for outputting a coupled optical signal to said photodiode, said photodiode outputting a photodiode electrical signal in accordance with the intensity of the coupled optical signal.

9. The optoelectronic device according to claim 8, further comprising:

controlling means for receiving the photodiode electrical signal and varying the electric field applied to said polarizer in accordance with the photodiode electrical signal, thereby varying the polarization of the polarized optical signal and consequently the intensity of the coupled optical signal, in such a manner that a maximum intensity is incident on said photodiode.

* * * * *